United States Patent [19]

Amante

[11] Patent Number: 5,065,502
[45] Date of Patent: Nov. 19, 1991

[54] METHOD FOR MODIFYING ELECTRICAL PERFORMANCE CHARACTERISTICS OF CIRCUIT PATHS ON CIRCUIT PANELS

[75] Inventor: Philip A. Amante, Pelham, N.H.

[73] Assignee: Lucas Duralith Art Corporation, Millville, N.J.

[21] Appl. No.: 252,192

[22] Filed: Sep. 30, 1988

[51] Int. Cl.$^5$ .............................................. H01C 17/06
[52] U.S. Cl. ..................................... 29/620; 361/402; 361/409; 338/309; 29/593
[58] Field of Search ............... 361/400, 402, 406, 409, 361/416; 338/308, 309, 328, 330, 195; 29/593, 620; 174/260, 261

[56] References Cited

U.S. PATENT DOCUMENTS

| | | | |
|---|---|---|---|
| 2,965,812 | 12/1960 | Bedford, Jr. | 361/406 |
| 2,989,705 | 6/1961 | Romano et al. | 174/260 X |
| 3,947,801 | 3/1976 | Bube | 338/309 X |
| 4,097,988 | 7/1978 | Hauschild . | |
| 4,368,281 | 1/1983 | Brummett et al. . | |
| 4,415,781 | 11/1983 | Frame et al. . | |
| 4,419,818 | 12/1983 | Grabbe . | |
| 4,503,418 | 3/1985 | Belopolsky . | |
| 4,539,622 | 9/1985 | Akasaki | 361/402 X |
| 4,575,601 | 3/1986 | Taguchi et al. . | |
| 4,621,178 | 11/1986 | Taguchi et al. . | |

OTHER PUBLICATIONS

AMP Keyboard Encyclopedia Catalog 81-646 Issued 9-81.
AMP Keyboards 4503-1 Issued 9-81.

Primary Examiner—Harold Broome
Assistant Examiner—Paramita Ghosh
Attorney, Agent, or Firm—Nixon & Vanderhye

[57] ABSTRACT

The present invention discloses a method of printing an electrical component onto a substrate to join a pair of circuit path elements to complete a circuit path to modify the electrical performance thereof, comprising the steps of: providing a selected surface region of a dielectric substrate 52 with a pair of conductive path elements 58, oriented at a selected angle with respect to each other; selecting a location along said reference axis at which to print a third conductive path element transverse to the reference axis, and printing a third conductive path element at the selected location thereby joining portions of both of the pair of conductive path elements 58, 64 thereby defining a discrete circuit path; determining the resulting electrical performance characteristics thereof and incrementally modifying the location of the printed transverse conductive path element along the associated mutually angled pair of conductive path elements 58, 64 in subsequent printing steps.

9 Claims, 3 Drawing Sheets

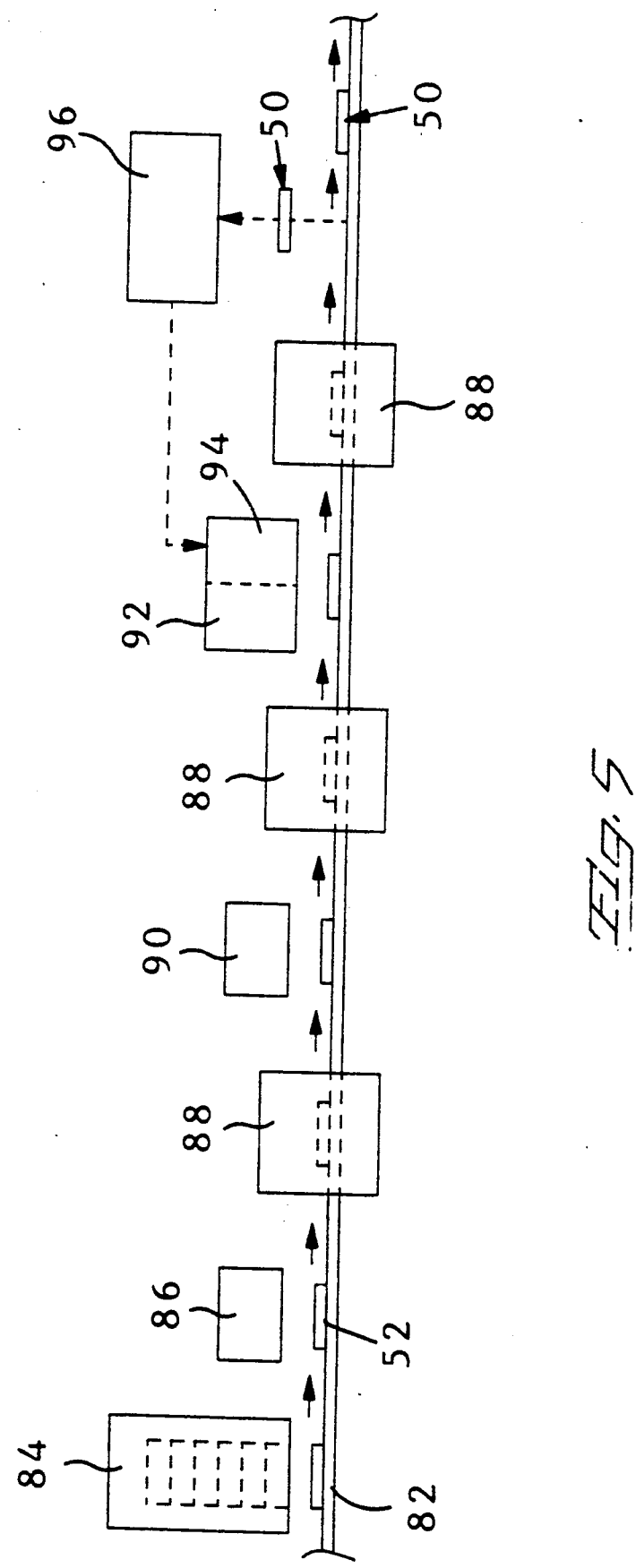

METHOD FOR MODIFYING ELECTRICAL PERFORMANCE CHARACTERISTICS OF CIRCUIT PATHS ON CIRCUIT PANELS

FIELD OF THE INVENTION

This invention relates to electrical circuit panels and in particular to a method for modifying the electrical performance characteristics of discrete circuit paths thereon.

BACKGROUND OF THE INVENTION

Circuit panels having screened circuitry are well known in the art. Typically a conductive ink, such as a carbon or silver ink, is screened onto the surface of the circuit panel in a desired configuration. The substrate used for the panels, which are generally referred to as circuit boards, may be a rigid member or a flexible member also known in the art as membrane or flexible circuits. The term "circuit panel" as used in this application encompasses the various types of substrates. These circuit panels are used in a variety of applications.

Depending upon the the type of product in which the circuit panel is used, it is often desirable to include devices such as light emitting diodes (LEDs) as indicia, for example, that a particular circuit is energized. To extend the life of such devices, it is generally desirable to reduce the voltage to the LED members by use of resistors. These resistors may be discrete elements or may be screened onto the surface of the substrate. Both leaded and surface mountable resistors having specific resistance values are readily available for mounting to circuit panels, thus enabling one to uniformly select the desired resistance to be used with the LEDs. Printed resistors may also be used on circuit panels. Since these resistors are "created" during the manufacturing of the circuit panel, printing resistors with the desired electrical performance characteristics presents problems not associated with discrete component elements.

The value of a printed resistor depends, inter alia, upon the resistance of the ink used, the shape of the resistor and the amount of "real estate" available on the panel for the resistor. The available space determines the amount of a conductive ink that can be disposed between discontinuous portions of the circuit path electrically connected to the LED or other device. The value of the resistance also is affected by a number of processing variables, such as the mesh of the screen, the percentage ratio of conductive material to filler in the ink, the thickness of the deposited layer, and the viscosity of the ink, which may change during the course of manufacturing the circuit panel primarily owing to evaporation of the solvent. As a result of these variables, circuit panels screened at the beginning of the manufacturing process may have resistors of a different value than circuit panels screened at the end of the manufacturing cycle. The finished circuit panels, therefore, may have LEDs of varying intensity and protection from high voltage.

In order to maintain an acceptable tolerance range for the electrical characteristics of the resistors, it is necessary to monitor the manufacturing process for circuit panels and make adjustments when necessary. Heretofore, adjustments to the value of the resistors was accomplished by reformulating or remixing the ink or by using a different size mesh screen or shape of resistor with the more viscous ink. These methods, however, require the screen to be cleaned or the apparatus taken apart to remove and replace the screen, which may require considerable down time for the equipment.

It is desirable, therefore, to have a method for on-line adjustment of the resistance value and one that may quickly be adjusted by the operator of the equipment.

SUMMARY OF THE INVENTION

It is an object of the present invention to provide a means by which the electrical performance characteristics the discrete circuit path may be readily modified during the manufacturing process.

It is another object of the invention to provide a means whereby the value of the electrical performance may be incrementally modified to result in acceptable electrical performance characteristics of succeeding circuit paths.

It is also an object of the invention to have a method for on-line adjustment of the resistance value and one that may quickly be adjusted by the operator of the equipment.

In accordance with the present invention, the method of printing an electrical component onto a dielectric substrate, to join a pair of circuit path elements, to complete a discrete circuit path, and to modify the electrical performance characteristics thereof, comprises the steps of: providing a selected surface region of a dielectric substrate with a pair of spaced apart conductive path elements coextending lengthwise along a reference axis and spaced from each other, the pair of conductive path elements being oriented at a selected angle with respect to each other; selecting a location along the reference axis at which to print a third conductive path element transverse to the reference axis, the distance between portions of the ones of the mutually angled pair of conductive path elements at the selected location being dependent upon the selected location; and printing a third conductive path element at the selected location along the reference axis and transverse thereto, thereby at least physically and integrally joining portions of both of the pair of conductive path elements, the transverse conductive path element at least electrically associated with the pair of conductive path elements, thereby defining a discrete circuit path having an electrical component therein capable of conducting an electrical current having certain electrical performance characteristics. The discrete circuit path is testable to determine the resulting electrical performance characteristics, thus enabling comparison thereof with a given range of acceptable performance characteristics. Upon an unacceptable result being determined, production of succeeding circuit paths may be modified by appropriately modifying the location of the electrical component and its associated transverse conductive path element along the associated mutually angled pair of conductive path elements. This correspondingly modifies the length of the transverse conductive path element disposed between the pair and controllably changing the quantity of conductive material disposed between the pair of conductive path elements to result in an acceptable electrical performance characteristics of succeeding discrete circuit paths.

The invention is further directed to articles made in accordance with the invention.

The invention itself, together with further objects and attendant advantages of the invention will be best understood by reference to the following detailed description, taken in conjunction with the accompanying drawings.

BRIEF DESCRIPTION OF THE DRAWINGS

FIG. 5 is a diagrammatic representation of the process of the present invention.

DETAILED DESCRIPTION OF THE DRAWINGS

Figure 1:
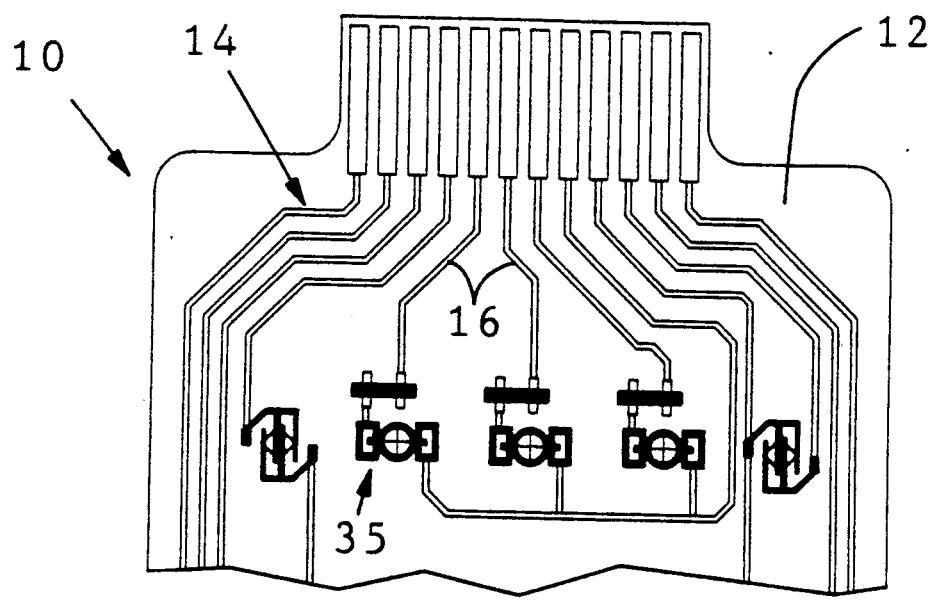
FIG. 1 is a fragmentary top plan view of a circuit panel made in accordance with the prior art.
Figure 2:
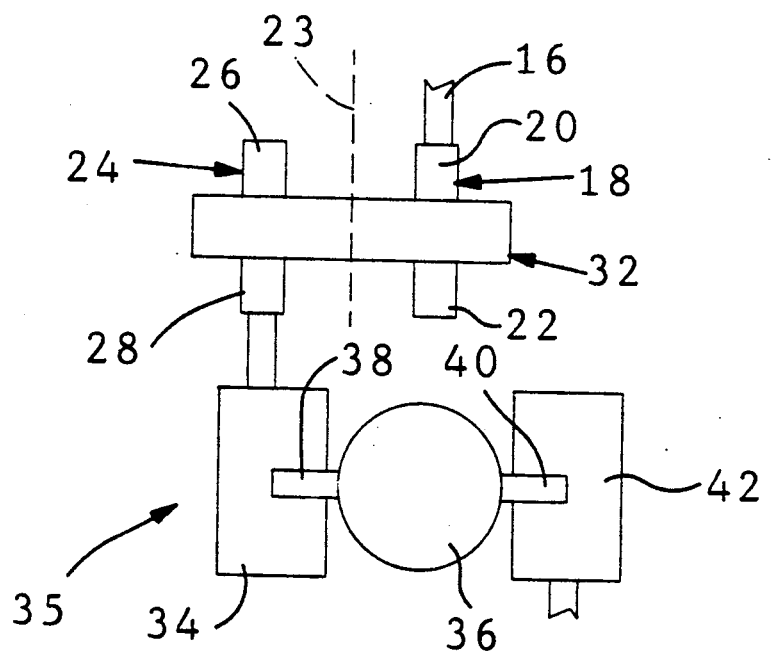
FIG. 2 is an enlarged view of a portion of the circuit panel of FIG. 1.

FIGS. 1 and 2 illustrate a circuit panel portion 10 comprised of a dielectric substrate 12 having circuitry pattern 14 disposed thereon. Circuitry pattern 14 includes a plurality of discrete circuit paths 16 each including a region, designated generally as 35 having an electrical component modifying the electrical performances of the circuit to an LED. The details of region 35 are best seen in FIG. 2. Circuit path 16 includes a pair of conductive path elements or pads 18, 24 extending essentially parallel to each other in a side-by-side relationship and laterally spaced from a reference axis 23. Conductive path elements 18, 24 have first ends 20, 26 and second ends 22, 28 respectively. An electrical component 32 is screened onto substrate 12 transverse to reference axis 23 and at least physically and integrally joins first and second conductive path elements 18, 24. In the embodiment shown, the electrical component 32 is a resistor, which is used to modulate the voltage going to a light emitting diode member 36. Electrical component 32 is a rectangle that has been disposed intermediate respective first and second ends 20, 22; 26, 28; of the first and second conductive path elements 18, 24 respectively. Conductive path element 24 is electrically connected to LED member 36 through first conductive pad 34, and first LED lead 38. Second LED lead 40 is electrically connected through conductive pad 42 to the remaining circuitry (not shown) of the circuit panel.

For purposes of illustration, the invention will be described in terms of printed resistors used for a plurality of light emitting diodes (LED) members on a circuit panel. It is to be understood that the method is not limited solely to resistors in series with LEDs. The method applies to the use of surface mounted and leaded devices controllable through the use of resistors, capacitors and the like. The electrical characteristics of circuit paths electrically connected to other devices such as liquid crystal displays (LCDs), integrated circuit (IC) chips and the like may also be altered by components such as resistors and capacitors. The electrical components are preferably printed on the panel by known techniques such as screen printing or transfer printing. The method also applies to circuit panels having circuit paths formed by various known methods including but not limited to etching, screen printing and transfer printing.

The resistance of electrical component 32 as seen in FIGS. 1 and 2, is determined by the resistivity of the ink used to form component 32 and the distance between the first and second conductive path elements 18, 24. Since elements 18 and 24 are essentially parallel to each other, electrical component 32 may be screened onto panel 10 in any location intermediate the ends of path elements 18, 24. The value of the resistor would remain the same. Typically the resistor value is given in terms of ohms per square unit. Thus it can be seen that the square units of component 32 would be the same regardless of the position of component 32 between the respective first and second ends 20, 22; 26, 28 of the conductive path elements 18, 24 respectively. In order to maintain the desired electrical performance characteristics of the resistor, it is necessary, therefore, to monitor the viscosity of the ink and reformulate the ink or adjust the size of the rectangle 32 or the size of screen mesh to compensate for changes in the ink or modify other printing methods.

Figure 3:
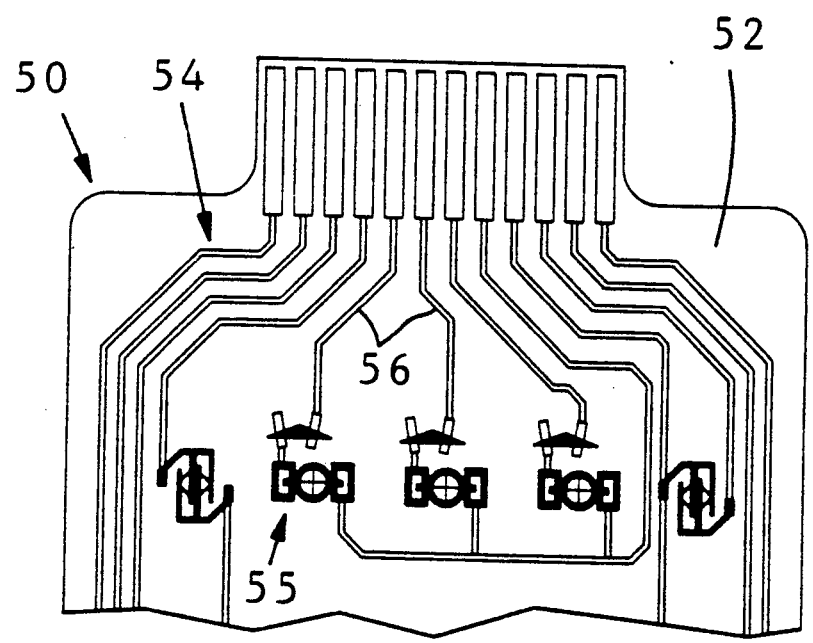
FIG. 3 is a fragmentary top plan view of a circuit panel made in accordance with the invention.
Figure 4:
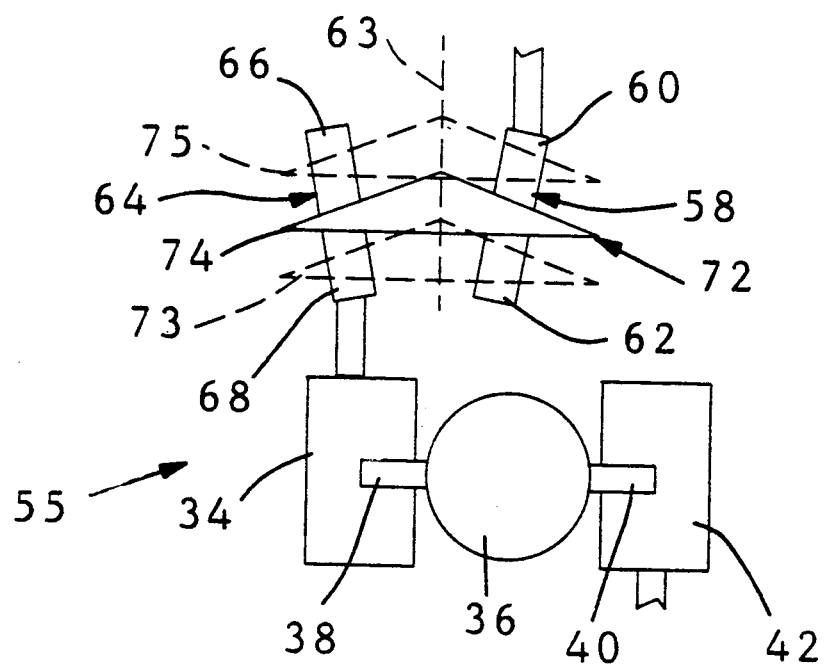
FIG. 4 is an enlarged view of a portion of the circuit panel of FIG. 3.

Referring now to FIGS. 3 and 4, circuit panel 50 of the present invention is comprised of a dielectric substrate 52 having a circuitry pattern 54 disposed thereon. Circuitry pattern 54 includes a plurality of regions designated generally as 55, each of which includes an electrical component 72 for modifying the electrical performances of the discrete circuit paths 56 to an LED 36. Details of region 55 are best seen in FIG. 4. Preferably circuitry pattern 54 and electrical component 72 are screen printed onto the substrate. Other methods for forming circuit paths may be used. In the embodiment shown, the electrical component 72 is a resistor, which is used to modulate the voltage going to a light emitting diode member 36. Circuitry pattern 54 includes a plurality of discrete circuit paths 56 having first and second conductive path elements or pads 58, 64 extending length wise along a reference axis 63 and spaced from each other. Conductive path elements 58, 64 are oriented at a selected angle with respect to each other, the angle preferably being in the range of 30 to 60 degrees.

First and second conductive path elements 58, 64 have first ends 60, 66 and second ends 62, 68 respectively. As can be best seen in FIG. 4, the distance between first and second conductive path elements 58, 64 decreases as one moves along reference axis 63 from respective first ends 60, 66 to second ends 62, 68. An electrical component 72, shown as a triangle, is screened onto substrate 52 transverse to the reference axis 63 such that component 72 physically and integrally joins first and second path elements 58, 64 and a transverse conductive path element of component 72 electrically joins path elements 58, 64. In accordance with the invention, the position of electrical component 72 and its associated transverse conductive path element along reference axis 63 may be varied, thus varying the square units of component 72 between the conductive path elements 58, 62. To provide the maximum amount of flexibility for adjusting the square units of resistance, resistor 72 is preferably formed in the shape of a triangle. The amount of square units of a triangular resistor is changed more rapidly per increment of axial movement than that of a rectangular resistor.

As is shown in FIG. 4, electrical component 72 is positioned at 74, which is approximately in the middle of the conductive path elements 58, 62. In terms of a resistor, if component 72 is positioned closer to the first ends 60, 66, shown in phantom at 75, there is a greater amount of square units of the resistor between path elements than if the transversely positioned resistor is located nearer second ends 62, 68 of the conductive path elements 58, 64, shown in phantom at 73. Component 72, therefore, provides a greater amount of resistance when located at position 75, than it does when located at position 73. Since the resistance provided by component 72 can be changed by screen printing component 72 at different locations along the reference axis 63, modifications to the electrical characteristics of the discrete circuit path may readily be made by moving the relative location of the printing screen and selected resistor location on the circuit panel 50. FIGS. 3 and 4 further show conductive path element 62 is electrically connected to LED 36 through first pad element 34, and first LED lead 38. Second LED lead 40 is electrically connected through conductive pad 42 to the remaining circuitry (not shown) of the circuit panel in the same manner as previously described for panel 10 of FIG. 1 of the prior art.

Since the value of the resistor can be changed by moving the selected location at which the electrical component is disposed transverse to the reference axis 63, incremental changes can be made during the manufacturing process to compensate for changes in the viscosity of the ink or other variables. This capability allows any change to be readily made by the machine operator without the need for reformulating the ink or replacing the screen, thus providing a more cost effective manufacturing process and circuit panels having acceptable electrical performance characteristics.

The dielectric substrate used in making the present invention may be a rigid member known as a circuit board or a flexible material to make what is known in the art as membrane or flexible circuits. A number of suitable materials for substrates are known in the art. The screened circuitry is typically made from a screen printable conductive carbon or silver inks, however other conductive inks made with materials such as copper, nickel and gold may also be used. One suitable silver ink is available from E.I. DuPont de Nemours & Co., Inc. as a Screen Printable Polymer Thick Film for Circuitry, No. 5006. A variety of screen printable conductive inks are commercially available. The screened electrical component, can be made from the same ink as the circuit or from a compatible ink. Factors to be considered in selecting the ink for a component having the desired electrical characteristics include the printability and electrical characteristics of the ink and the space available on the circuit panel for the component. One suitable material is available from Acheson Colloids Co. under the trade name Carbon-Electrodag 423SS.

In accordance with the present invention circuit panels 50 as shown in FIG. 3, are preferably made in the following manner. At a first screen printing location, circuitry patterns 54 are printed onto the dielectric substrate 52 in the desired configuration such that the desired discrete circuit paths 56 include a pair of conductive path elements 58, 64 extending length wise along a reference axis 63 and oriented at a selected angle with respect to each other. The screened panel is then dried or cured in an oven to evaporate the solvent from the ink. The dried screened circuit panel is moved to a second screening location where the electrical component 72 is screened onto the surface of substrate 52, electrically, physically and integrally joining portions of both of the pair of conductive path elements 58, 64. Preferably the initial screening of component 72 is done at the approximate center of the outwardly extending conductive path elements 58, 64. The circuit panel is then cured to dry component 72 and the performance characteristics are tested. The results of the tests are compared to a given range of acceptable performance characteristics. Upon determining an unacceptable result, the position of component 72 and its associated transverse conductive path element is adjusted along reference axis 63 until the test provides a circuit which conforms within the acceptable range. Periodically during the course of production, circuit panels 50 are tested to assure that the electrical performance characteristics remain within the acceptable range. The present invention, therefore, provides a means for making incremental modification of the resistance value without the need for reformulating the ink or providing a screen having a larger or smaller opening to deposit a greater or lesser amount of resistor ink. The value of the resistant increases as a greater portion of the transverse conductive element is utilized between the outwardly mutually angled conductive elements.

The present invention can also be used for electrical components comprising capacitive elements. In this process, the circuit panel is subjected to an intermediate screening step comprising the application of a dielectric material over the initial conductive traces prior to the screening of the electrical component having associated therewith a transverse conductive element. The dielectric material may be an oven dryable material or curable by ultraviolet (uv) light. One suitable uv curable material is available from Acheson Colloids Co. under the trade name ML 25094.

The method of the invention is represented diagrammatically in FIG. 5. Referring now to FIGS. 4 and 5, substrate 52 is placed on a supported conveyor belt 82 from a source of supply 84. The substrate may be in the form of rigid members, sheets of flexible film or a roll of flexible film. Dielectric substrate 52 having a selected region thereon for the location of at least one screened electrical component 72 is moved to a first screening location 86 where the circuitry pattern 54 and the conductive path elements 58, 64 are screened onto the substrate surface such that the conductive path elements 58, 64 are oriented along a reference axis at a selected small angle with respect to each other as previously described. The intermediate article 51 comprising substrate 50 and circuit pattern 54 is then moved to a curing oven 88 to dry the conductive ink and then moved to station 92 where electrical component 72 is disposed over the desired location along conductive path elements 58, 64. The completed circuit panel 50 is moved through another oven 88 where the material is dried. Periodic samples of the completed circuit 50 are tested at a test station 96 and are compared with the range of acceptable performance characteristics. If an unacceptable result is determined adjustments are made at 94 to alter the position of the screen, thereby changing the location of component 72 along reference axis 63 so that subsequently completed circuit panels will have acceptable electrical performance characteristics. FIG. 5 also includes an intermediate screening station 90 for screening dielectric material on at least the conductive path elements 58,64 of circuit panel and an additional oven to dry the dielectric material when the process is used to form capacitors on the panels.

The present invention provides a means whereby the resistance can be altered by screening a resistor at a different selected locations along the conductive path elements. It is thought that the method of screening electrical components onto circuit panels of the present invention and many of its attendant advantages will be understood from the foregoing description. It will be apparent that various changes may be made in the form, construction, and arrangement of the part thereof without departing from the spirit or scope of the invention or sacrificing all its material advantages. The form herein is merely a preferred or extemporarily embodiment thereof.

What is claimed is:

1. A method of printing an electrical component onto a substrate to join a pair of circuit path elements, to complete a discrete circuit path, and to modify the electrical performance characteristics thereof, each discrete circuit path being of the type having a pair of spaced apart conductive path elements respectively disposed on either side of a reference axis and the electrical component containing a third conductive path element associated with said pair of conductive path elements, the third conductive path element being printed onto the substrate transverse to the reference axis and at least physically and integrally joining the conductive path elements, the method comprising the steps of:

providing a selected surface region of a dielectric substrate with a pair of conductive path elements coextending lengthwise along a reference axis and spaced from each other, said pair of conductive path elements being oriented at a selected angle with respect to each other;

selecting a location along said reference axis at which to print a third conductive path element transverse to said reference axis, the distance between portions of the ones of said pair of conductive path elements at said selected location being dependent upon said selected location; and printing a third conductive path element at said selected location along said reference axis and transverse thereto, thereby at least physically and integrally joining portions of both of said pair of conductive path elements, said transverse conductive path element at least electrically associated with said pair of conductive path elements thereby defining a discrete circuit path having an electrical component therein capable of conducting an electrical current having certain electrical performance characteristics;

testing said discrete circuit path to determine the resulting electrical performance characteristics thereof to enable the comparison thereof with a given range of acceptable performance characteristics; and upon an unacceptable result being determined, producing succeeding ones of such discrete circuit paths by appropriately incrementally modifying the location of the transverse conductive path element along the associated pair of conductive path elements, thereby correspondingly modifying the length of the transverse conductive path element disposed between the pair and controllably changing the quantity of conductive material disposed between the pair of conductive path elements to result in acceptable electrical performance characteristics of said succeeding discrete circuit paths.

2. The method of printing an electrical component onto a substrate as described in claim 1 wherein said transverse conductive path element conductively engages said pair of conductive path elements thereby defining a resistor for said discrete circuit path.

3. The method of printing an electrical component onto a substrate as described in claim 1 further including the steps of selecting a dielectric substrate having a surface upon which circuit paths will be applied at selected regions; moving a said selected region to a first application location and applying a pair of conductive path elements onto said substrate surface coextending lengthwise along a reference axis and spaced from each other, said pair of conductive path elements being oriented at a selected angle with respect to each other.

4. The method of printing an electrical component onto a substrate as described in claim 1 further the step of moving a said selected region to an intermediate printing location and printing a dielectric layer over portions of said pair of conductive path elements such that said dielectric layer will lie between said pair of conductive path elements and said transverse conductive path element, defining a capacitor for said discrete circuit path.

5. A method of printing an at least partially conductive component onto a substrate, said component having a desired electrical property, said method comprising steps of:

providing a pair of at least partially conductive path elements coextending lengthwise about a reference axis, said pair of path elements oriented at a selected angle with respect to each other and spaced apart from each other;

selecting a location along said reference axis for printing a third at least partially conductive path element transverse to said reference axis;

printing said third at least partially conductive path element at said selected location along said reference axis and transverse thereto, electrically interrelating said pair of path elements, said electrically interrelated path elements having an electrical property; and measuring said electrical property of said combination of elements and adjusting said selecting step for subsequent printed elements to achieve a desired electrical property.

6. A method of sequentially printing resistors onto a substrate, comprising the steps of:

printing a pair of conductive path elements;

printing a third conductive path element at one of a location and orientation with respect to said pair of conductive path elements where at said one of a location and orientation, said three conductive path elements comprise a resistor having a resistance;

measuring said resistance;

comparing said measure resistance with a desired resistance; and adjusting at least one of said location and said orientation for subsequent third conductive path element printing steps such that the measured resistance in subsequent resistors is a function of said desired resistance.

7. The method according to claim 6 wherein said third conductive path element printing step is at a location along an axis of symmetry between said pair of conductive path elements.

8. The method of claim 6, wherein said pair of conductive path elements are at a selected non-zero angle with respect to another and said third conductive path element printing step includes the step of printing said third conductive path element transverse to and at a location along a line bisecting said non-zero angle.

9. A method of sequentially printing an electrical component onto a substrate, said electrical component having an electrical characteristic, said method comprising the steps of:

printing a pair of conductive path elements on said substrate;

printing a third conductive path element at one of a location and an orientation with respect to said pair of conductive path elements, where, at said one of a location and orientation, said three conductive path elements have an electrical characteristic;

measuring said electrical characteristic of said three conductive path elements;

comparing said measured characteristic with a desired electrical characteristic; and adjusting at least one of said location and said orientation for subsequent third consecutive path element printing steps such that the measured characteristics in subsequent electrical components is a function of said desired electrical characteristic.

* * * * *